(12) United States Patent
Kastberg et al.

(10) Patent No.: US 6,191,480 B1
(45) Date of Patent: Feb. 20, 2001

(54) UNIVERSAL LAND GRID ARRAY SOCKET ENGAGEMENT MECHANISM

(75) Inventors: Eric Kastberg, Walden; Jeffrey Zitz, Poughkeepsie, both of NY (US)

(73) Assignee: International Business Machines Corporation, Armonk, NY (US)

(*) Notice: Under 35 U.S.C. 154(b), the term of this patent shall be extended for 0 days.

(21) Appl. No.: 09/392,768

(22) Filed: Sep. 7, 1999

(51) Int. Cl.[7] ............................ H01L 23/34; H01L 23/52; H01L 23/04
(52) U.S. Cl. ............................ 257/727; 257/692; 257/698
(58) Field of Search ........................ 257/688, 689, 257/692, 698, 727

(56) References Cited

U.S. PATENT DOCUMENTS

| | | | |
|---|---|---|---|
| 5,074,799 | 12/1991 | Rowlette, Sr. | 439/91 |
| 5,151,040 | 9/1992 | Tanaka | 439/73 |
| 5,161,893 | 11/1992 | Ohno et al. | 439/71 |
| 5,282,111 | 1/1994 | Hopfer | 361/704 |
| 5,344,334 | 9/1994 | Laub et al. | 439/331 |
| 5,364,286 * | 11/1994 | Matsuoka | 439/330 |
| 5,376,010 | 12/1994 | Petersen | 439/71 |
| 5,413,489 | 5/1995 | Switky | 439/71 |
| 5,473,510 | 12/1995 | Dozier, II | 361/719 |
| 5,485,351 | 1/1996 | Hopfer et al. | 361/704 |
| 5,493,237 | 2/1996 | Volz et al. | 439/71 |
| 5,499,929 | 3/1996 | Miyazawa | 439/331 |
| 5,518,410 | 5/1996 | Masami | 439/71 |
| 5,556,293 | 9/1996 | Pfaff | 439/266 |
| 5,648,893 | 7/1997 | Loo et al. | 361/820 |
| 5,677,247 | 10/1997 | Hundt et al. | 437/209 |
| 5,691,041 | 11/1997 | Frankeny et al. | 428/209 |
| 5,905,638 * | 5/1999 | MacDonald, Jr. et al. | 361/769 |
| 5,917,703 * | 6/1999 | Murphy | 361/704 |
| 5,945,736 * | 8/1999 | Rife et al. | 257/719 |
| 6,021,045 * | 2/2000 | Johnson | 361/704 |
| 6,042,412 * | 3/2000 | Murr | 439/331 |
| 6,075,699 * | 6/2000 | Rife | 361/704 |
| 6,086,387 * | 7/2000 | Gallagher et al. | 439/71 |

* cited by examiner

*Primary Examiner*—Ngân V. Ngô
(74) *Attorney, Agent, or Firm*—Ira D. Blecker

(57) ABSTRACT

A ring shaped pressure plate is provided in a socket and land grid array module assembly for urging the module into electrical contact. The ring shaped pressure plate is not only readily removable but it also engages a land grid array module in a fashion which reduces stress to chip, chip underfill, chip lid, and chip thermal paste structures. In an alternate embodiment of the present invention, pressure is applied in a similar manner except that lockably engageable arms supporting pressure rails on opposite sides of the module are employed. Both embodiments reduce stress and provide a land grid array engagement mechanism which is readily removable and which also provide a central opening or central portion access to chip module components for purposes of cooling such as by providing direct attachment to heat sinks or indirect attachment to heat sinks through heat spreaders.

9 Claims, 3 Drawing Sheets

UNIVERSAL LAND GRID ARRAY SOCKET ENGAGEMENT MECHANISM

BACKGROUND OF THE INVENTION

The present invention is generally directed to mechanisms for engaging electronic circuit modules with or in land grid array (LGA) socket devices. More particularly, the present invention is directed to a mechanism which reduces stress on electronic circuit components while at the same time provides access for direct lid or heat sink attachment. Even more particularly, the present invention is directed to land grid array socket mechanisms which apply a continuous yet distributed force for engagement, but which still permit easy removal of the electronic circuit component portion.

The land grid array interconnection system is one that is widely requested and is a highly desirable mechanism for engagement between electronic circuit components and underlying sockets for mechanical and electrical interconnection. However, land grid array interconnection mechanisms suffer from certain disadvantages. In particular, these mechanisms typically require relatively large compressive forces in order to maintain sufficient electrical contact throughout the card/socket/module system. Typically these forces are generated by clamping a bulky pressure plate which fits entirely over the top surface of the module assembly. This pressure plate is typically fastened to the card via screws. However, the compressive force generated by such a mechanism can impart large tensile, compressive and shear stresses on sensitive electrical components such as the silicon chip, the chip carrier (which is typically ceramic), the chip underfill material, lid adhesive and any thermal compound which may be disposed between the chip and an overlying lid. Accordingly, packaging structures employing direct lid attach (DLA) ceramic packaging are not particularly well suited for standard LGA interconnection mechanisms. However, it is nonetheless very desirable to be able to employ direct lid attach packaging.

Over time it is also possible that certain failures can occur in standard land grid array engagement mechanisms. In particular these include interface delamination, bulk material fracture and material creep. These stresses are predicted to cause some highly stressed modules to fail.

An added disadvantage to the standard pressure plate land grid array interconnection system is that it entirely covers the top surface of the module. Thus, thermal performance is significantly degraded due to the low thermal conductivity of the pressure plate which typically comprises a material such as steel which is provided for its strength. However, the thermal conductivity of steel is significantly less than the thermal conductivity of such materials as aluminum or copper. Additionally, the added thermal interface that exists between the pressure plate and the top surface of the module also acts to degrade thermal performance. Since the land grid array interconnection mechanism is largely targeted for leading edge and high performance, high thermal stress modules, this limitation in thermal performance is very desirable particularly in modules that generate significant amounts of heat.

SUMMARY OF THE INVENTION

In accordance with one embodiment of the present invention a semiconductor packaging assembly includes a land grid array socket together with a land grid array module. This module includes a semiconductor device disposed on top of a carrier which has top portions of its exposed areas surrounding the die so as to form a lip or at least a lip-like structure. More particularly, a ring shaped pressure plate is employed in contact with the lip portion of the module. This pressure plate includes integral spring members which provide a mechanism for urging the pressure plate against the module so as to ensure uniform contact between the module and the land grid array socket.

In accordance with another embodiment of the present invention a semiconductor package assembly comprises a land grid array socket and land grid array module substantially is described above. However, in this alternate embodiment a support frame structure which is affixed to a printed circuit card is provided. This support frame includes two hinge support structures disposed on opposite sides. At least two pressure rails supported by the hinge are disposed so as to be pivotally moved against the lip portion of the semiconductor carrier. Flexible arms disposed through the hinge support are attached to the pivotable pressure rails so as to be able to move them against the top exposed lip portion of the carrier. Additionally, means are provided for lockably engaging these arms so as to ensure continuous pressure being applied to the land grid array module.

Accordingly, it is an object of the present invention to provide a mechanism for insuring electrical and mechanical contact between a land grid array module and its corresponding socket.

It is also an object of the present invention to provide a semiconductor packaging mechanism which provides a land grid array module engagement mechanism for which removability of the land grid array module is readily available.

It is a still further object of the present invention to provide a semiconductor package and packaging mechanism which provides access to an LGA module for purposes of providing either a heatsink or a direct lid attachment to the module.

It is yet another object of the present invention to provide a mechanism for more easily removing thermal energy from semiconductor chip modules, particularly LGA modules.

It is a still further object of the present invention to provide a semiconductor packaging and engagement mechanism for which mechanical stresses have been reduced.

It is also an object of the present invention to provide an LGA interconnection mechanism for producing relatively large compressive forces to maintain electrical contact throughout a card/socket/module assembly.

It is yet another object of the present invention to eliminate the utilization of bulky pressure plate devices employed in LGA engagement mechanisms.

It is still another object of the present invention to eliminate tensile, compressive and shear stresses on sensitive semiconductor module components including silicon ships, chip carriers, chip underfill material, adhesives and thermal compounds found in semiconductor packaging systems.

It is yet another object of the present invention to eliminate stresses in LGA packaging which tend to produce bulk material fractures and material creep.

Lastly, but not limited hereto, it is an object of the present invention to provide an LGA packaging mechanism for high power electronic circuit chips and modules.

DESCRIPTION OF THE FIGURES

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

DETAILED DESCRIPTION OF THE INVENTION

Figure 1:
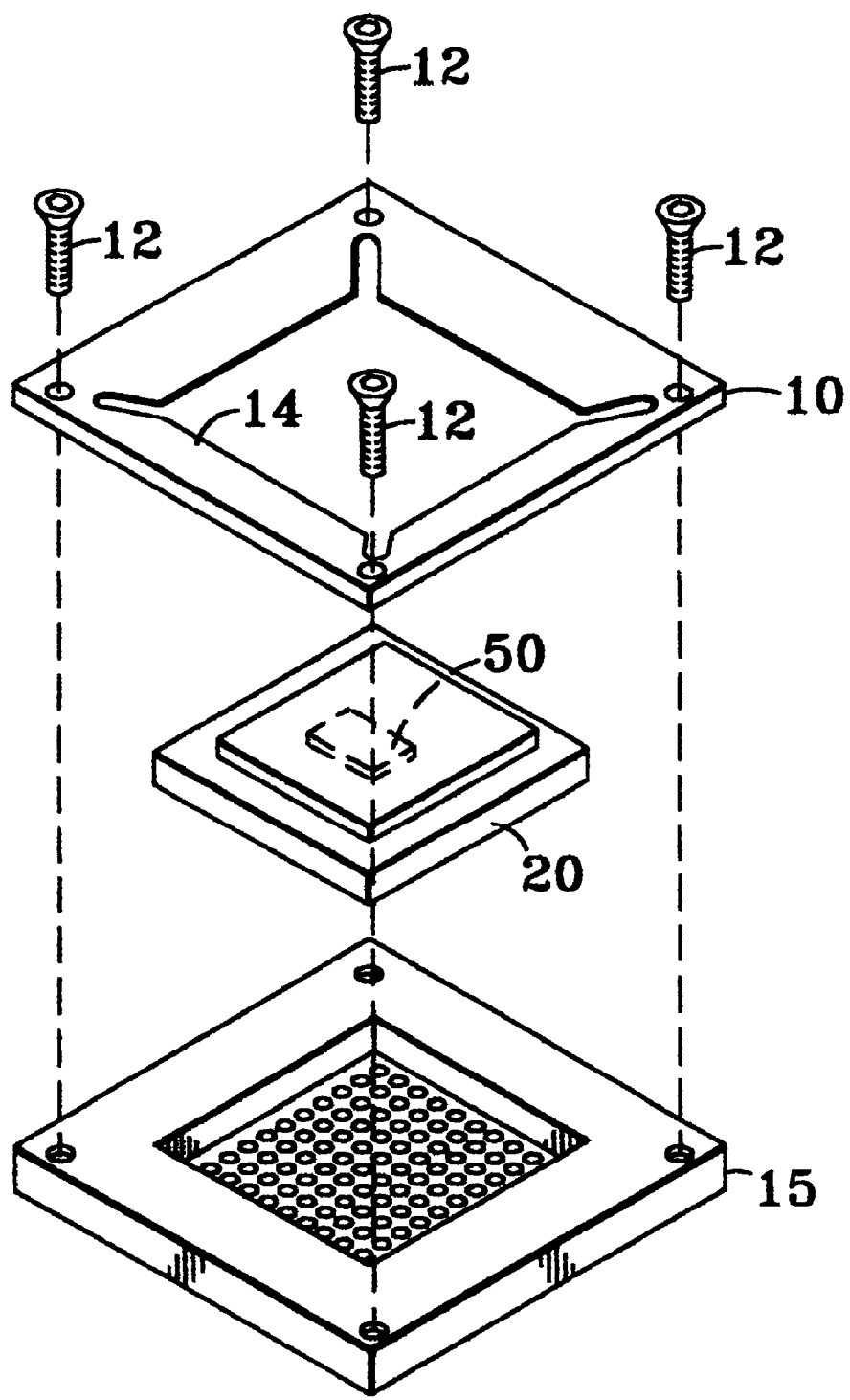
FIG. 1 is an isometric view illustrating the embodiment of the present invention which employs a ring shaped pressure plate.
Figure 2:
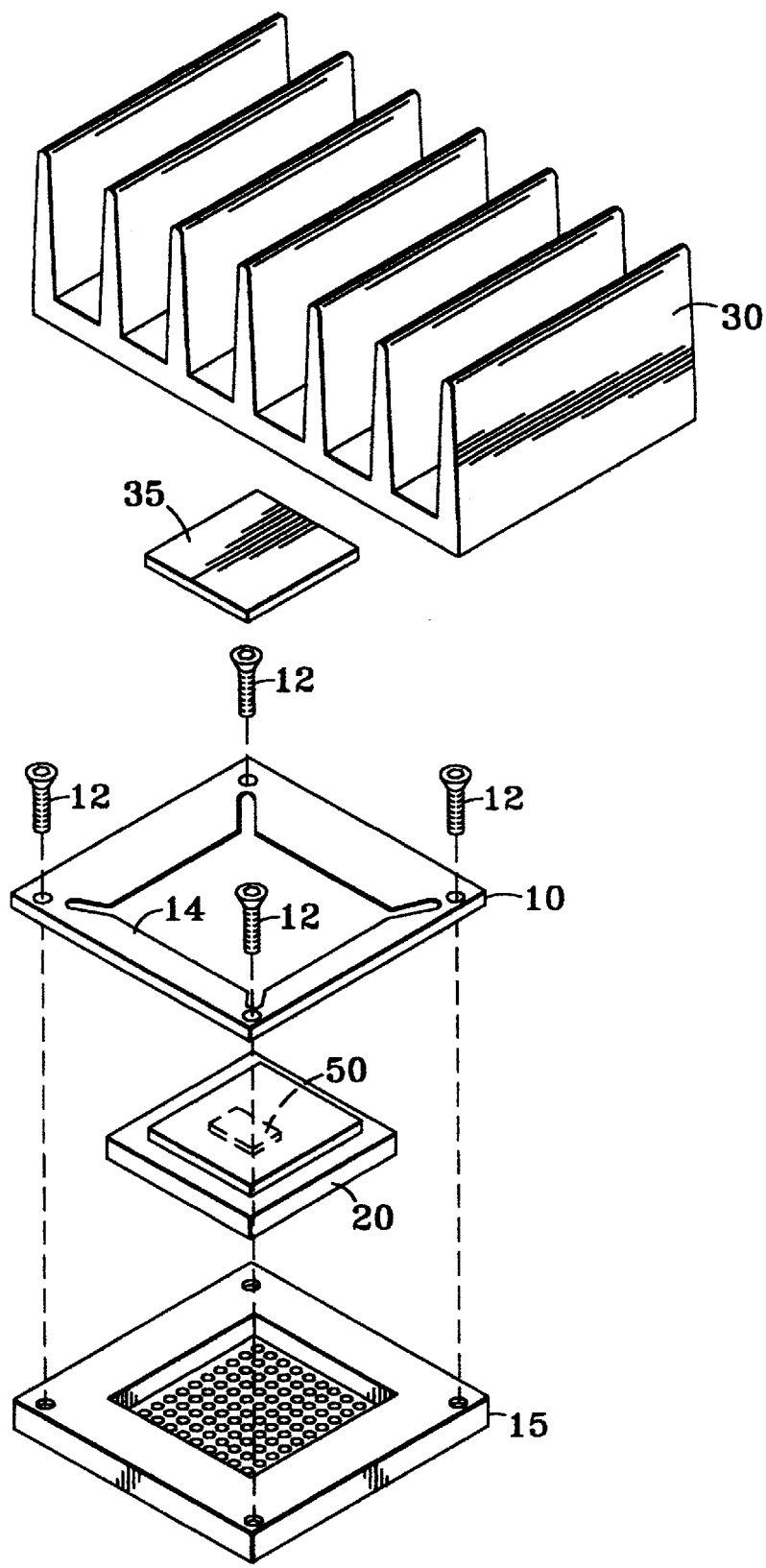
FIG. 2 is a view similar to FIG. 1 but more particularly illustrating the inclusion of a heat sink device.

FIG. 1 illustrates an isometric view of a preferred embodiment of one version of the present invention. In this embodiment LGA socket 15 receives land grid array module 20 which includes semiconductor chip or die 50. Module 20 includes an upper surface which is exposed so as to be engagable with spring portions 14 of ring shaped pressure plate 10. Pressure plate 10 includes integral spring portions which are urged against the top, exposed portion of module 20. In particular, pressure plate 10 is fastened to socket 15 by means of screw fasteners 12. It is noted however that any convenient means for fastening and securing pressure plate 10 to socket 15 may be employed. However screw fasteners are preferred since they are adjustable as to pressure and are also easily removable. Pressure plate 10 includes an open central portion through which chip 50 or a heat spreader is accessible. The spring force provided by means of integral spring portions 14 supplies force that is desired for engaging electrical contact between module 20 and land grid array socket 15. Pressure plate 10 is therefore seen to be able to apply force directly to the chip carrier periphery rather than to the chip or to the chip lid. This eliminates mechanical stresses that might otherwise occur in critical module components such as the chip, chip underfill material or in adhesives. Compression of peripheral spring portions 14 provides a smooth, even engagement force while flattening at a full engagement position so as to allow the lid of a module to protrude through the opening. In this fashion commercially available heat sinks such as that shown in FIG. 2 as reference numeral 30 may be employed. In particular, FIG. 2 also illustrates the inclusion of heat spreader 35. Additionally, it is noted that the embodiment shown in FIGS. 1 and 2 also permits the utilization of modules employing direct lid attach packaging.

Figure 3:
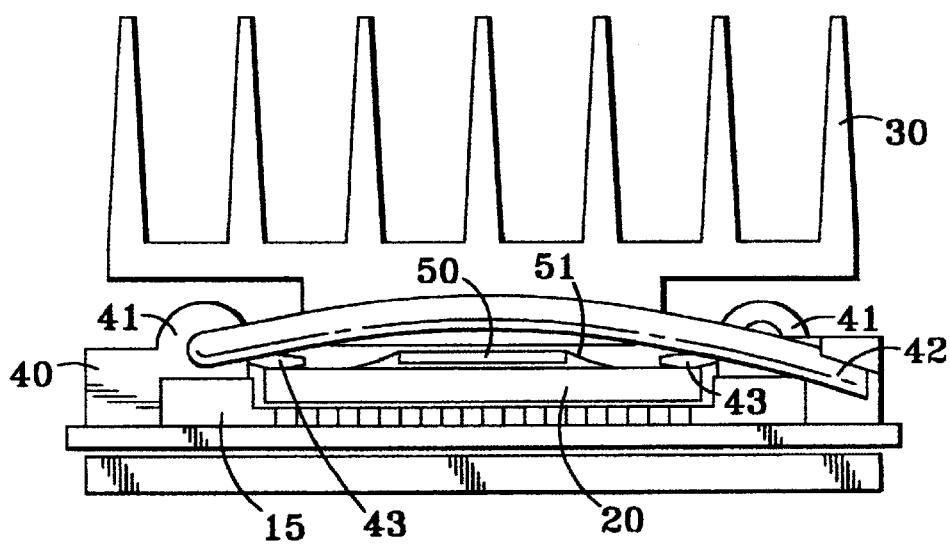
FIG. 3 is a side elevation view illustrating an alternate embodiment of the present invention in which pressure is applied by means of a pair of pressure rails disposed on opposite sides of the LGA module.
Figure 4:
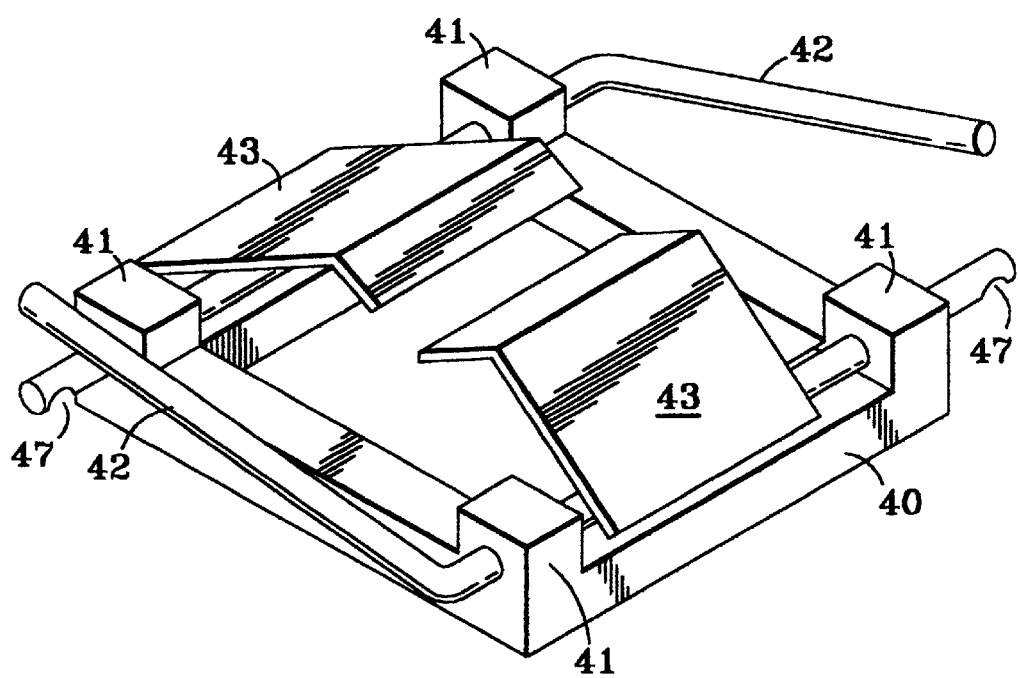
FIG. 4 is an isometric view similar to FIG. 3 but more particularly illustrating the positioning and operation of pressure rails and lever arms.

FIG. 3 illustrates another version of the present invention. In particular, FIG. 3 illustrates a side elevation view of an arrangement similar to that shown in FIGS. 1 and 2 with respect to socket 15 and module 20. However, chip underfill material 51 is more readily visible in FIG. 3. Additionally, in accordance with the second version of the present invention there is shown support frame structure 40 which surrounds module 20. See also FIG. 4 below. In particular, frame 40 includes hinge support members 41 through which arms 42 are disposed, arm 42 is an L-shaped structure, as is apparent from the isometric view shown in FIG. 4. In particular, arm 42 includes pressure rail 43 affixed to arm 42, preferably by means of a spot welding operation. In this embodiment arms 42 and pressure rails 43 are provided on either side of module 20, which includes a top exposed lip portion against which pressure rails 43 may be urged by a pivoting operation of arms 42 which provide spring action for maintaining a constant pressure whenever the module is disposed in the socket and the arms 42 are locked into position. This locking engagement is preferably provided by the inclusion of notches 47 disposed at the ends of the arms which extend through hinge support members 41. These notches are more particularly visible in FIG. 4. Arm 42 (also referable to as latching bale 42) provides a smooth even engagement force which permits the lid of a module to protrude through the frame support so that commercially available heat sinks are easily attachable to the apparatus. Additionally, as noted, the captive engagement/disengagement hardware shown (namely bales 42 and platens or rails 43) allows a multiple and expedient removals and insertions of modules without tools and thus seen to be readily applicable in field replacement operations.

In preferred embodiments of the present invention pressure plate 10 preferably comprises a material such as spring steel. Additionally, pressure rail 43 preferably comprises a material such as spring steel while arms 42 comprise a material such as or stainless steel. Support frame 40 preferably comprises a material such as copper or aluminum.

From the above, it is seen that both embodiments of the present invention provide a low profile, LGA engagement mechanism which eliminates some stresses, reduces others and which provides easy attachment of heat sink devices. Accordingly, it is seen that the embodiments of the present invention illustrated herein fully meet all of the objects set forth above.

While the invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

The invention claimed is:

1. A semiconductor packaging assembly comprising:

a land grid array socket;

a land grid array module having a substantially flat carrier member having electrical contact with said socket, said carrier member also including a semiconductor die disposed on top of said carrier member so as to leave exposed a top portion of said carrier member substantially surrounding said die;

a ring-shaped pressure plate with integral spring portions in contact with said exposed top portion of said carrier;

means for urging said pressure plate against said socket.

2. The assembly of claim 1 is which said urging means comprises screws.

3. The package assembly of claim 1 further including a heat sink disposed in contact with said semiconductor die.

4. The package assembly of claim 3 further including a heat spreader disposed between said heat sink and said die.

5. The assembly of claim 1 further including the lid directly attached to said semiconductor die.

6. A semiconductor package assembly comprising:

a land grid array socket;

a land grid array module having a substantially flat carrier member having electrical contact with said socket, said carrier member also including a semiconductor die disposed on top of said carrier member so as to leave exposed a top portion of said carrier member on opposite sides of said die;

a support frame structure affixed to a printed circuit card to which said socket is attached for electrical connection, said support frame having hinge support members also disposed on said same opposite die sides, at least two pressure rails supported by arms disposed said hinge members, said pressure rails being disposed so as to be pivotally urgable against said exposed top carrier portion on opposite sides of said semiconductor die;

flexible arms exposed through said hinge support members and pivotally attached to said pressure rails so as to be movable against respective ones of said carrier top portions; and means for lockably engaging said arms at the end of their pivotal motion.

7. The package assembly of claim 6 further including a heat sink in contact with said semiconductor die.

8. The assembly of claim 7 further including a heat spreader disposed between said heat sink and said die.

9. The assembly of claim 6 further including a lid directly attached to said semiconductor die.

* * * * *